United States Patent [19]
Berg et al.

[11] Patent Number: 6,142,802
[45] Date of Patent: Nov. 7, 2000

[54] GUIDE RAIL AND CAM SYSTEM WITH INTEGRATED CONNECTOR FOR REMOVABLE TRANSCEIVER

[75] Inventors: Jerry Berg, Kasson; David Peter Gaio; William Kim Hogan, both of Rochester, all of Minn.

[73] Assignee: International Business Machines Corporation, Armonk, N.Y.

[21] Appl. No.: 09/441,248

[22] Filed: Nov. 16, 1999

Related U.S. Application Data

[62] Division of application No. 09/216,104, Dec. 18, 1998.

[51] Int. Cl.[7] .................................................. H01R 13/62
[52] U.S. Cl. ......................... 439/180; 385/75; 439/630; 439/924.1
[58] Field of Search ............................. 174/59; 361/728, 361/730, 775; 439/342, 180, 260, 267, 630, 632, 633, 681, 762, 775, 924.1, 358, 357, 660; 381/61; 385/75

[56] References Cited

U.S. PATENT DOCUMENTS

| | | | |
|---|---|---|---|
| 4,509,190 | 4/1985 | Spector | 381/61 |
| 5,211,566 | 5/1993 | Bates et al. | 439/66 |
| 5,731,633 | 3/1998 | Clayton | 257/723 |
| 5,767,999 | 6/1998 | Kayner | 359/163 |
| 5,827,084 | 10/1998 | Biernath | 439/262 |
| 5,879,173 | 3/1999 | Poplawski | 438/138 |

*Primary Examiner*—Neil Abrams
*Assistant Examiner*—Michael C. Zarroli
*Attorney, Agent, or Firm*—Lawrence D. Maxwell; Matthew J. Bussan

[57] ABSTRACT

An electrical connector system has two connectors, one of which is included in a module mateable with the other connector in a pluggable manner. The other connector includes an elongated guide rail and a connector block in which are retained two or more electrical contacts. Signal connections can be made in a predetermined sequence when the module is plugged into the other connector because the contact pads of the module are of different lengths. For example, sequencing the connection of power and ground signals with respect to data signals provides hot-pluggability. Also, a grounding contact on the module is engaged by a spring clip on the other connector to provide an additional or alternative grounding path.

12 Claims, 6 Drawing Sheets

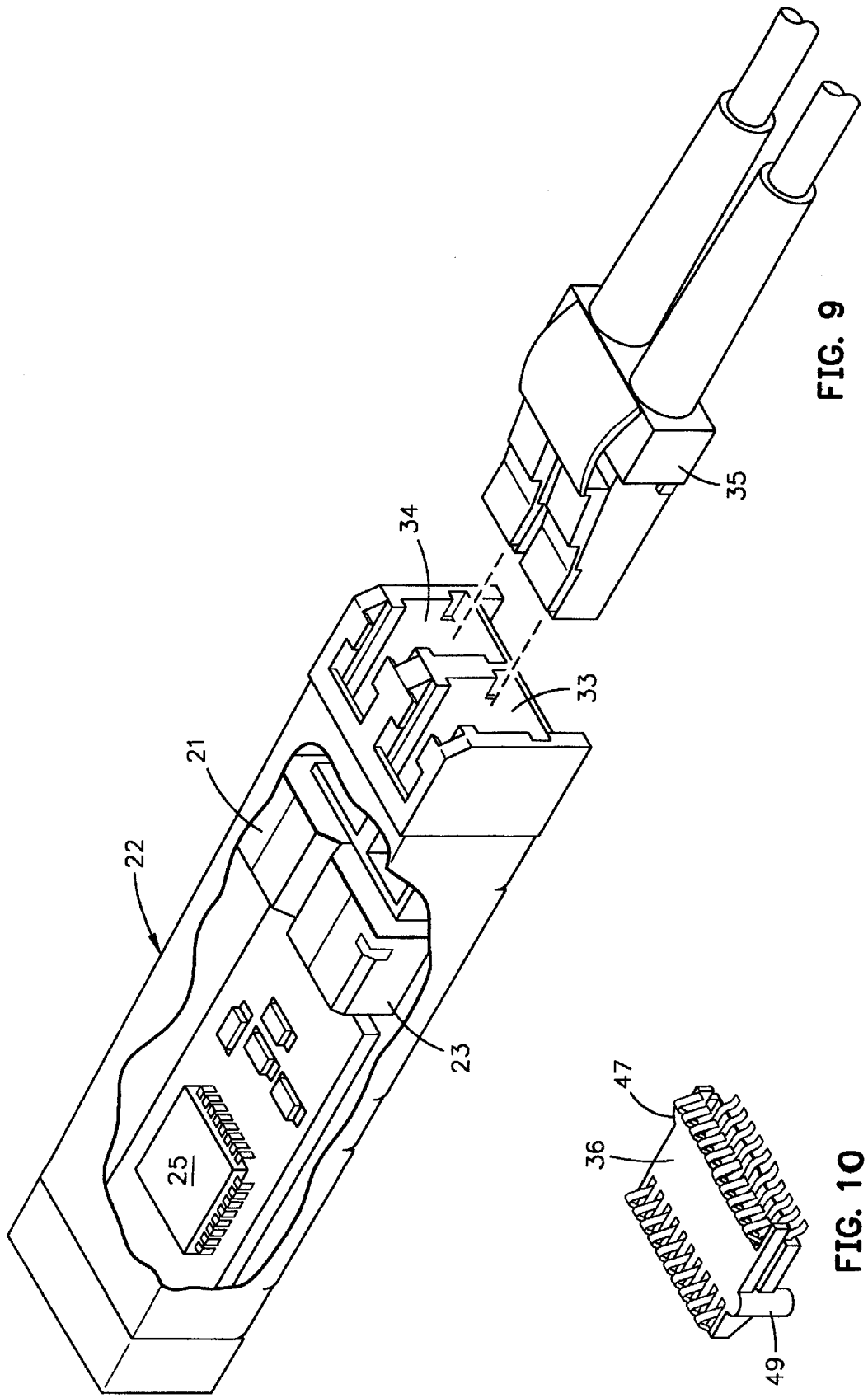

GUIDE RAIL AND CAM SYSTEM WITH INTEGRATED CONNECTOR FOR REMOVABLE TRANSCEIVER

CROSS-REFERENCE TO RELATED APPLICATION

This is a divisional of co-pending application Ser. No. 09/216,104, filed Dec. 18, 1998, incorporated herein by this reference in its entirety.

BACKGROUND OF THE INVENTION

1. Field of the Invention

The present invention relates generally to electronic connector systems and, more specifically, to low-profile connector systems for user-removable electronic modules, such as transceiver modules that interface with a computer.

2. Description of the Related Art

Electrical connectors are used to interconnect circuit cards and other electronic modules or assemblies. A connector commonly used in personal computer systems is known as a D-shell connector because the contact pins of the male connector and female connector are enclosed within generally D-shaped structures that mate to promote a secure mechanical connection as well as provide electromagnetic shielding. In a D-shell connector, contact pins of the male connector are frictionally received in contact holes of the female connector. The wiping action between the pins and holes minimizes the buildup of oxides or dirt that could impede electrical conduction. Connectors that have wiping mating parts define one of a number of general categories of connectors.

Another general category of connectors is defined by those connectors that have abutting mating parts. One such connector, illustrated in FIG. 1A, is known as the J-lead connector (10) because the electrical contacts 12 are generally J-shaped. A J-lead connector 10 is typically used to interconnect two circuit cards 14 and 16 that are disposed in a back-to-back orientation. The J-lead connector 10 is mounted on one of the circuit cards, typically by soldering one end of each contact 12 to a surface-mount pad (not shown) on the circuit card. The shape of contacts 12 provides some resiliency or springiness, and when circuit cards 14 and 16 are brought together, as illustrated in FIG. 1B, pads (not shown) on circuit card 16 make electrical and mechanical contact with contacts 12 of circuit card 16. Contacts 12 are deflected slightly, and the spring force exerted by the deflected contacts 12 against the contact pads promotes good electrical connection.

Various international and industry standards define the type of connectors used to interface computers to external communication devices such as modems, network interfaces, and other transceivers. A well-known type of transceiver developed by an industry consortium and known as a gigabit interface converter (GBIC) or serial optical converter (SOC) provides an interface between a computer and an Ethernet, Fibre Channel or other data communication environment. The D-shell connectors of such transceivers mate with a complementary D-shell connector mounted on the circuit card of the host computer.

It is desirable to miniaturize transceivers in order to increase the port density associated with the network connection (switch boxes, cabling patch panels, wiring closets, computer I/O, etc.). Various standards are known that define form factors for miniaturized electronic devices, such as the Small Form Factor (SFF) standard, which specifies an enclosure 9.8 mm in height by 13.5 mm in width and having a minimum of 24 electrical input/output connections. Miniaturizing a transceiver, however, raises a number of potential connector problems. These problems and deficiencies are satisfied by the present invention in the manner described below.

SUMMARY OF THE INVENTION

The present invention relates to an electrical connector system having two connectors in which one of the connectors includes a body and two or more electrical contacts. The body of that electrical connector is definable by three mutually perpendicular axes and has a connector block. The body, including the connector block, has a very low profile, and in certain exemplary embodiments it is preferably less than about 10 mm in height, i.e., the dimension defined by the third axis, to accommodate the Small Form Factor standard and to facilitate surface-mounting the bottom of the body on a circuit board. The connector block retains the contacts, which are spaced from one another in the direction of the first axis. One of the connectors includes a guide rail to facilitate mechanical mating of the connectors. In an exemplary embodiment, the connector block is at one end of the guide rail, which is elongated between a first end and a second end of the body along the first axis. One of the connectors also includes a camming element that, in response to a force of the mating connector being moved along the first axis, redirects the force in a direction having a component along the third axis so as to cause relative motion and resulting electrical contact between the contacts of the electrical connector and the contacts of the mating connector. In an exemplary embodiment, the camming element is a cam on the connector block having two oppositely inclined ramp sections. When the module, guided by the guide member, is moved into initial engagement with the cam, the first ramp lifts the mating connector, including its contacts, above the connector block. When the mating connector is moved further into engagement with the cam, the second ramp lowers the mating connector onto the connector block, with the contacts of the mating connector lowering onto and making contact with the contacts of the electrical connector. The camming motion minimizes wiping between the mating contacts. In addition, the contacts of the electrical connector are preferably somewhat resiliently deflectable to promote good electrical contact.

The contacts may be arrayed in two or more rows, each parallel to the second axis and having two or more contacts.

In an exemplary embodiment, the mating electrical connector that mates with the electrical connector having the body and the connector block is included in an optical transceiver module. Nevertheless, the connector system may be used in other arrangements and to couple other types of electronic modules or assemblies.

The foregoing, together with other features and advantages of the present invention, will become more apparent when referring to the following specification, claims, and accompanying drawings.

BRIEF DESCRIPTION OF THE DRAWINGS

For a more complete understanding of the present invention, reference is now made to the following detailed description of the embodiments illustrated in the accompanying drawings, wherein:

FIG. 9 is a perspective view of the transceiver module, partially cut away to shown the transceiver circuitry, illustrating the transceiver module mating with an optical cable; and FIG. 10 is a perspective view of the connector block portion of the camming connector.

DESCRIPTION OF A PREFERRED EMBODIMENT

Figure 1A:
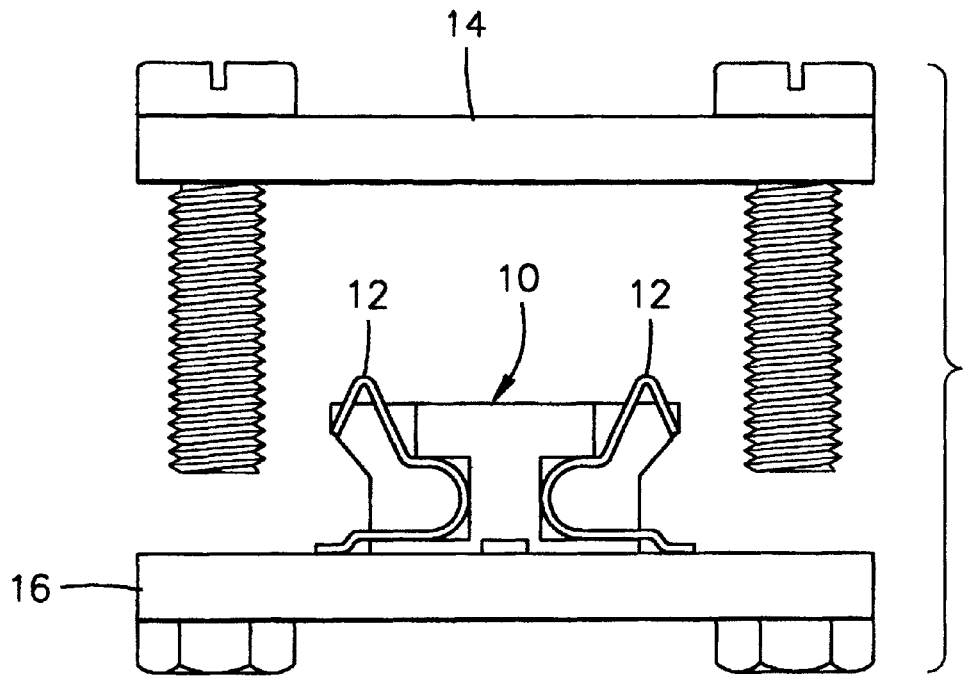
FIG. 1A is an end view of a prior art J-lead connector for coupling two circuit boards.
Figure 1B:
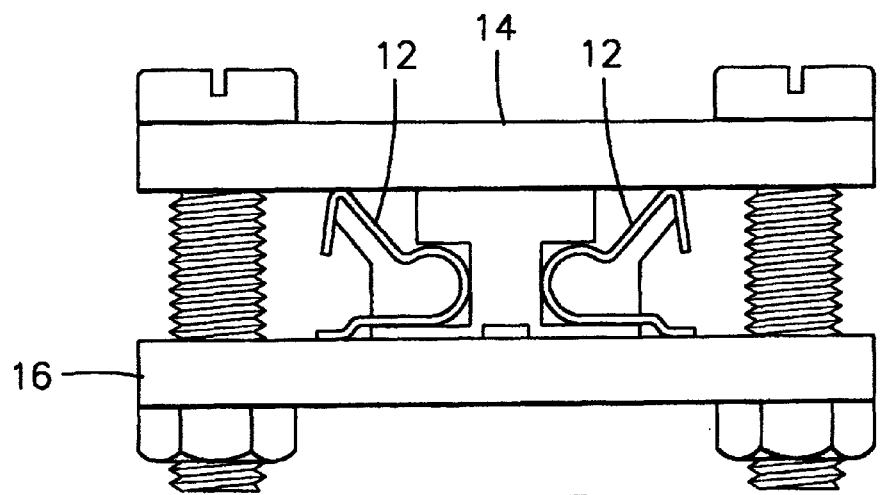
FIG. 1B is similar to FIG. 1A and illustrates the completion of electrical contact between the circuit boards using the J-lead connector.
Figure 2:
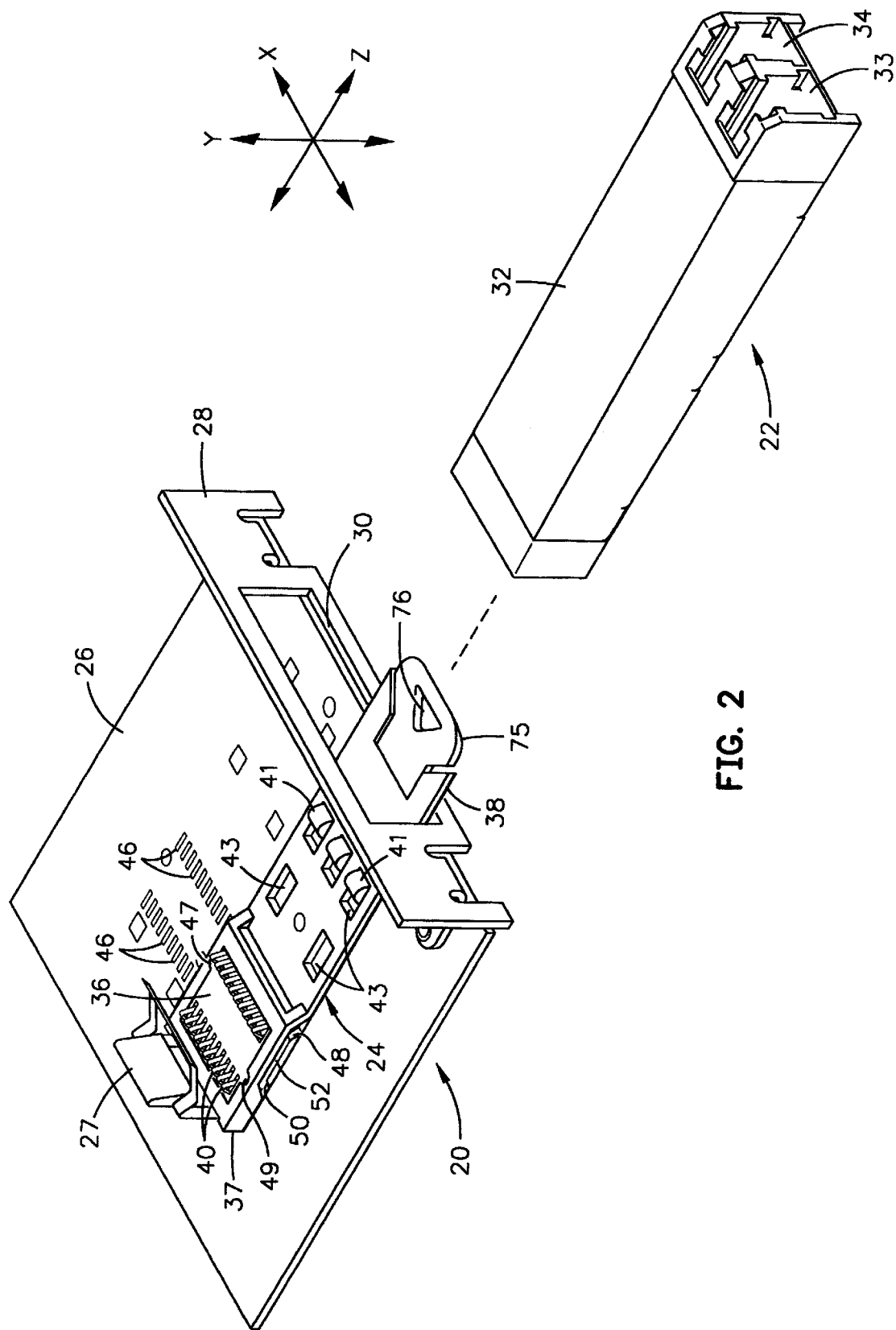
FIG. 2 is a perspective view of the connector system, showing an electronic assembly having a camming connector mateable with a transceiver module.

As illustrated in FIG. 2, a peripheral device port assembly 20 of a personal computer or similar device (not shown) is electrically and mechanically mateable with a data transceiver module 22. Transceiver module 22 is preferably a SFF version of the GBIC or SOC type and, as illustrated in FIG. 9, includes suitable optical transceiver electronics, such as a laser photodiode-based transmitter 21, a photodetector-based receiver 23, and suitable integrated circuit chips 25 that contain laser driver preamplifiers and other circuitry of the type conventionally included in optoelectronic transceivers. Module 22 receives and transmits serial optical data and serial electrical data, although parallel optical and/or parallel electrical transmission and reception is also contemplated within the realm of this invention. Module 22 communicates electrical signals to and from peripheral device port assembly 20 using the electrical connector system described below.

Assembly 20 includes a camming electrical connector 24 surface-mounted as described in further detail below on a printed circuit board 26. A spring clip 64 is also surface-mounted on circuit board 26. Assembly 20 also includes a bracket or bezel 28 mounted perpendicularly to circuit board 26. Bezel 28 has a rectangular opening 30 with substantially industry-standard dimensions and is capable of receiving transceiver module 22 having the PCMCIA standard height of 9.8 mm (maximum). In use, assembly 20 can be mounted in an orientation with bezel 28 parallel to and abutting a wall of a computer enclosure having a correspondingly dimensioned opening. Because the novel connector system of the present invention is mateable through an enclosure opening 30 having standard PCMCIA dimensions, connector 24 of the system can be mounted on an essentially standard peripheral device port assembly 20. In other words, computer device manufacturers can readily adapt their existing assemblies of this type to include the novel connector system of the present invention in place of conventional connector systems, such as those that use D-shell connectors.

A particular advantage of the connector system of the present invention is that module 22 can conform to the SFF standard. In accordance with the SFF standard, module 22 preferably has an enclosure 32 that is less than 9.8 mm in height and 13.5 mm in width. As used in this patent specification, the term "width" refers to the dimension or axis labeled "X" in FIG. 2, and the term "height" refers to the dimension or axis labeled "Y" in FIG. 2. In view of the increasing desire in the industry to miniaturize communication transceivers in order to increase port density, it has been suggested that newer transceivers that conform to the SFF standard have connectors that resemble a standard RJ-45 telephone jack, which is about 13.5 mm wide. Module 22 has optical input and output connectors 33 and 34 that, as illustrated in FIG. 9, are optically and mechanically mateable with an optical cable connector assembly 35. Module 22 thus receives serial optical signals at one end from optical cable connector assembly 35, converts them to electrical signals, and provides the electrical signals at the other end to assembly 20. Likewise, module 22 receives serial electrical signals at one end from assembly 20, converts them to optical signals, and provides the optical signals at the other end to optical cable connector assembly 35.

Figure 3:
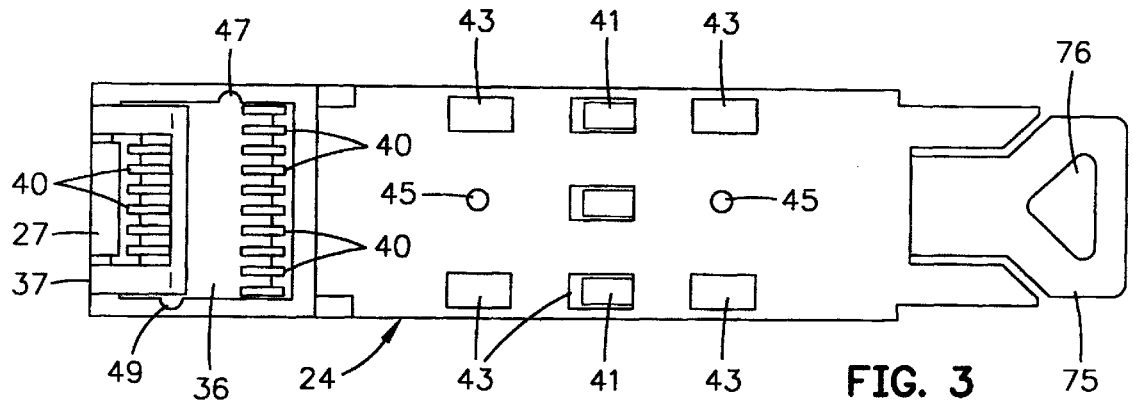
FIG. 3 is a top plan view of the camming connector.
Figure 4:
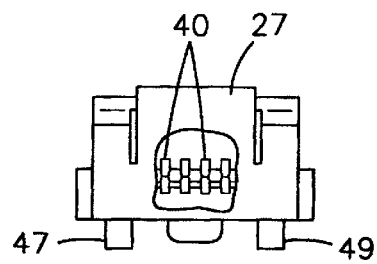
FIG. 4 is an end view of the camming connector.
Figure 5:
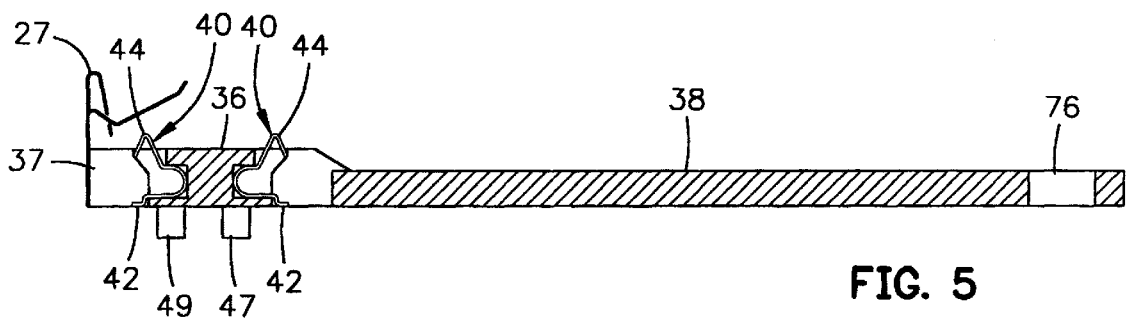
FIG. 5 is a sectional view of the camming connector.
Figure 6A:
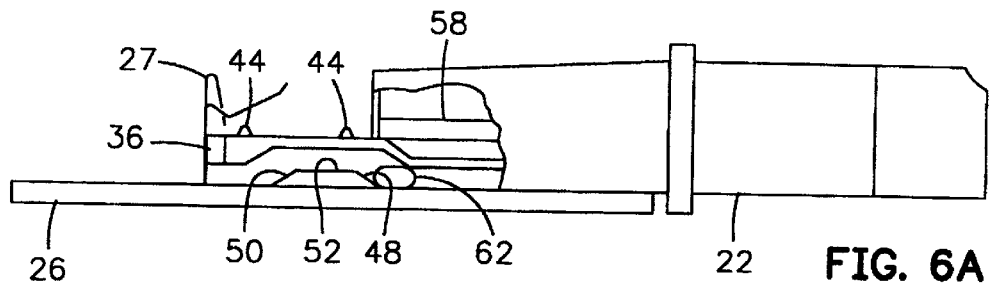
FIG. 6A illustrates the beginning of the mating action between the camming connector and the transceiver module.
Figure 6B:
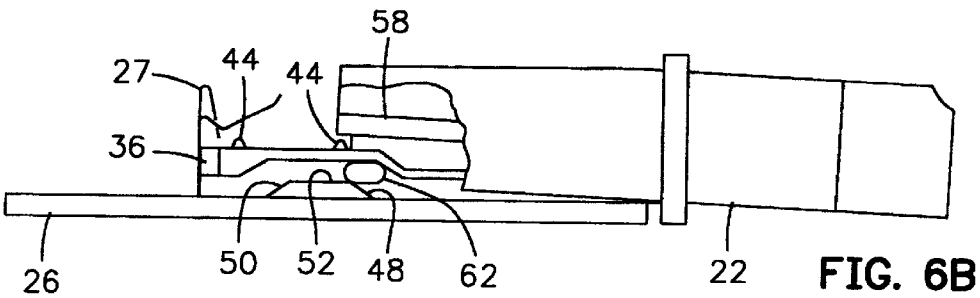
FIG. 6B is similar to FIG. 6A and illustrates further progression in the mating action.
Figure 6C:
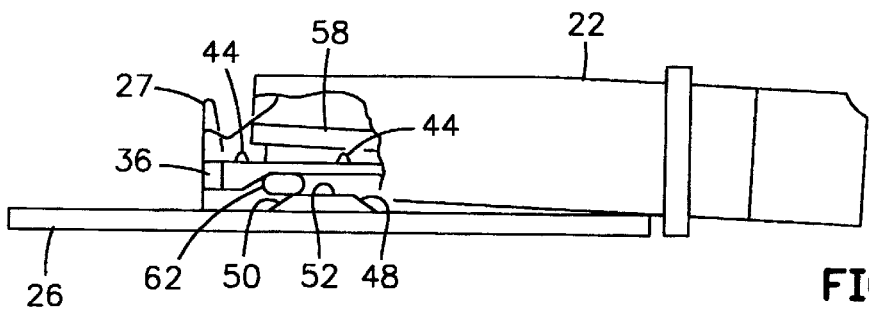
FIG. 6C is similar to FIGS. 6A–B and illustrates still further progression in the mating action.
Figure 6D:
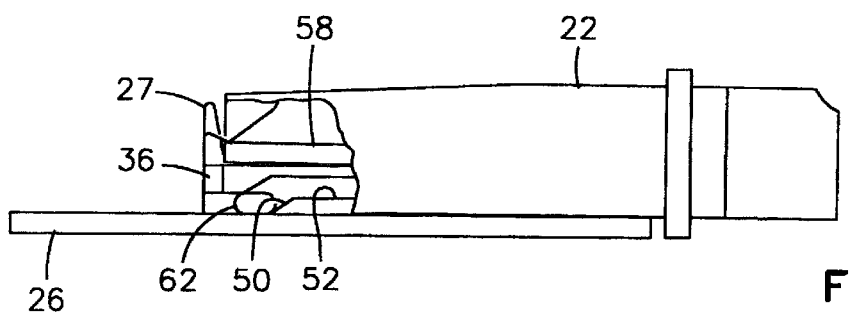
FIG. 6D is similar to FIGS. 6A–C and illustrates yet further progression in the mating action.
Figure 6E:
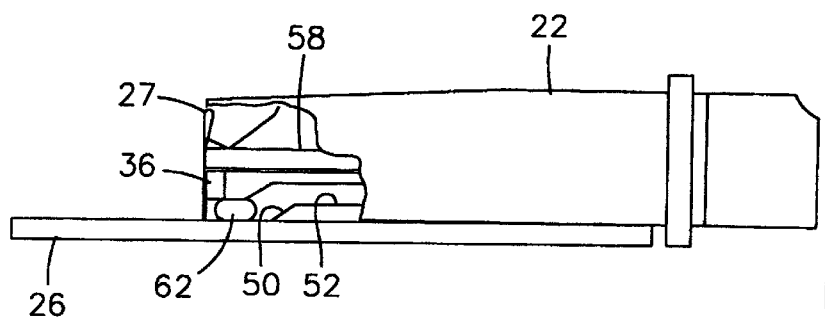
FIG. 6E is similar to FIGS. 6A–D and illustrates the end of the mating action, with the contacts fully mated.

With further reference to FIGS. 3–5, connector 24 includes a connector block 36 and an elongated, flat or tongue-shaped guide rail 38. Connector 24 may comprise any suitable number of parts. Preferably, connector block 36 is a separate part, illustrated in FIG. 10, that fits within a rectangular opening in a camming block 37 at one end of guide rail 38. Connector block 36 has two pins 47 and 49 that extend from its lower surface to facilitate mounting it to circuit board 26. Guide rail 38 is elongated in the dimension or axis labeled "Z" in FIG. 2. Connector 24, including connector block 36 and guide rail 38, is preferably no wider than about 12 mm. This miniaturization allows two or more such connectors 24 to be mounted side-by-side in a standard PCMCIA-width opening 30 to increase port density.

Two (or more in other embodiments) rows of electrical contacts 40 oriented in the X direction are mounted in connector block 36. Electrical contacts 40 are of the conventional J-lead type. That is, each contact 40 is a wire-like or strip-like member having a surface-mountable lower portion 42 connected via a generally U-shaped or J-shaped bend to an upper portion 44 that is somewhat resiliently deflectable with respect to lower portion 42. Lower portion 42 of each contact 40 is essentially flush with the lower surface of connector block 36, protruding only slightly to facilitate surface-mounting and soldering to pads 46 of circuit board 26. Circuit board 26 may comprise any suitable type of rigid or flexible printed circuit substrate, and conventional solder reflow processes can be used to surface-mount contacts 40. Upper portion 44 of each contact 40 protrudes slightly from the upper surface of connector block 36 to facilitate electrical contact, as described below. The upper surface of connector block 36 is substantially planar, and the plane defined by upper portions 44 collectively is substantially parallel to the lower surface of connector block 36. The upper and lower surfaces of connector block 36 and guide rail 38 are all mutually parallel and, when connector 24 is mounted on circuit board 26, are parallel to circuit board 26 as well.

Electrical coupling between connector 24 and surface-mount pads of circuit board 26 is achieved through, in addition to contacts 40, a grounding strip having three upper contact portions 41. Upper contact portions 31 protrude through three of the seven apertures 43 in guide rail 38 a sufficient distance above the upper surface of guide rail 38 to resiliently contact mating grounding contacts (not shown) inside module 22. The grounding strip has seven lower contact portions (not shown) that protrude through all seven apertures 43 sufficiently to surface-mount them to pads on circuit board 26 on which a signal at ground potential would exist during operation of the system. Although the contemplated purpose of contact portions 41 is grounding, in other embodiments of the invention such secondary contacts may be used for communication of other types of signals. Two holes 45 through guide rail 38 and a pin (not shown) extending perpendicularly from the lower surface of guide rail 38 facilitate mounting connector 24 on circuit board 26.

Connector 24 has a cam defined by two oppositely inclined ramps 48 and 50, having lower ends substantially level with the lower surface of connector 24 and upper ends coupled together via a flat region 52, i.e., a portion parallel to the upper and lower surfaces of connector 24. Ramps 48 and 50 may each be inclined at any suitable acute angle with respect to these surfaces, and the angles can be complementary or entirely different. Connector block 36 has indented portions shaped correspondingly to ramps 48 and 50 and region 52. In view of the corresponding ramp and indentation features, the cam can be described another way as having a groove with two portions inclined at generally opposing or complementary angles connected by a flat portion. Although in the illustrated embodiment of the invention the camming element is a cam having the above-described structure, other embodiments may have alternative cam mechanisms or other suitable types of camming elements.

Figure 7:
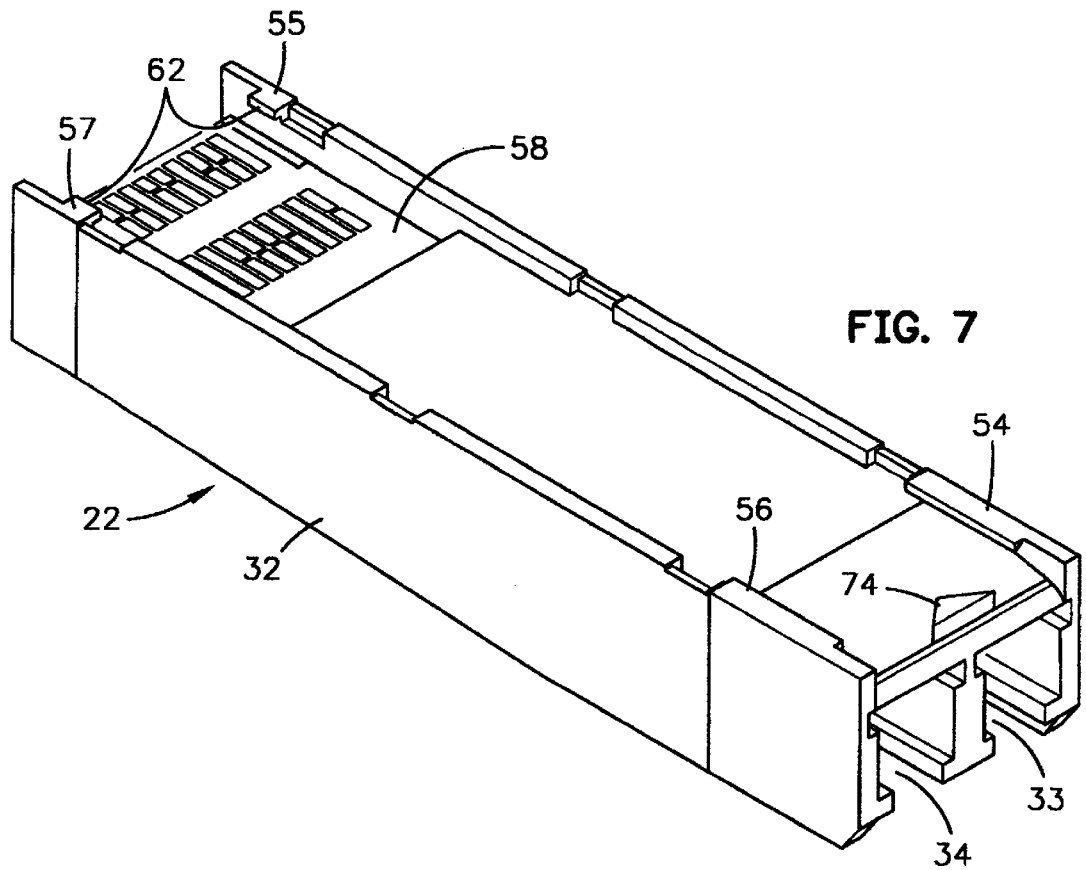
FIG. 7 is a perspective view, showing the bottom of the transceiver module.

To use the connector system, a user engages the forward end of module 22 on guide rail 38. As illustrated in FIG. 7, flanges 54, 55, 56 and 57 on the lower edges of the side walls of enclosure 32 define channels in which guide rail 38 fits closely and can be slid. Thus, module 22 is guided by guide rail 38 as the user continues to slide module 22 in the direction of connector block 24, i.e., in the Z direction. In this orientation, flanges 54–57 are substantially parallel to circuit board 26.

Figure 8:
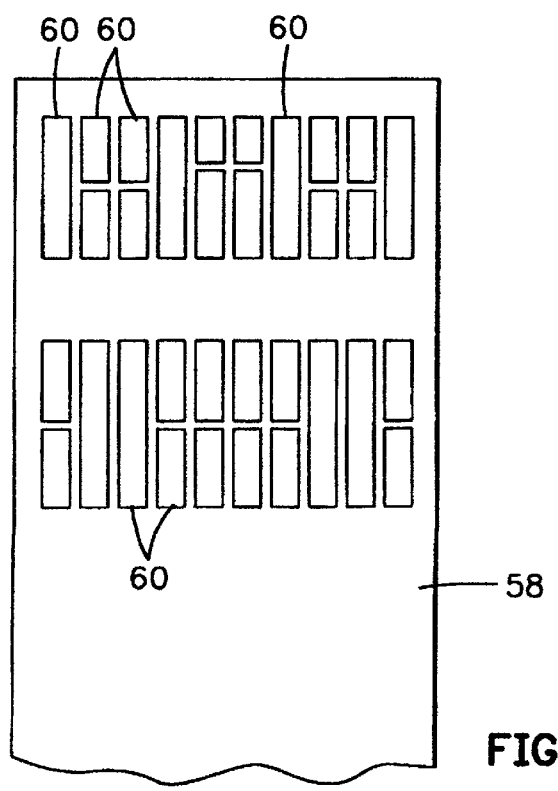
FIG. 8 is a top plan view of the contact pads of the transceiver module circuit board.

As illustrated in FIGS. 6A–6E, illustrating this mating action, module 22 has an internal circuit board 58 that is substantially parallel to edges 54 and 56. As illustrated in FIG. 8, the lower surface of circuit board 58 has electrical contact pads 60. Contact pads 60 are arranged in a complementary manner with respect to contacts 40 in connector block 36. In other words, the position of each contact pad 60 on circuit board 58 mirrors the position of a contact 40 in connector block 36. Contact pads 60 are preferably of different lengths to provide a signal connection sequencing function when electrical contact is made. When the forward end of module 22 reaches connector block 36, the cam-follower projections 62 of flanges 55 and 57 travel in or follow the cam groove. Initially, they engage the lower ends of ramps 48. Ramps 48 redirect to the Y direction a portion of the force they experience in the Z direction. Projections 62 thus ride up ramps 48 (i.e., partially in the Y direction and partially in the Z direction), lifting forward end of module 22 and with it circuit board 58. When projections 62 reach the upper ends of ramps 48 in response to continued force applied by the user in the Z direction, they move onto flat regions 52. When projections 62 reach the other end of flat regions 52, they ride down ramps 50 in a similar manner (i.e., partially in the Y direction and partially in the Z direction). The groove walls that are complementary to ramps 50 redirect to the Y direction a portion of the force they experience in the Z direction. As projections 62 move downwardly, circuit board 58 descends toward the upper surface of connector block 36. As circuit board 58 descends, contact pads 60 of circuit board 58 make contact with upper portions 44 of contacts 40, deflecting them slightly in the Y direction.

Also, as module 22 nears the end of its travel, spring clip 27 engages the upper surface of circuit board 58 and makes contact with a grounding contact pad (not shown) thereon. Spring clip 27 is deflected slightly by circuit board 58, and resiliently biases circuit board 58 downwardly to further mechanically secure module 22 to connector 24 while providing an additional path for coupling module 22 to the ground potential of assembly 20.

Although the majority of the relative movement that occurs between contact pads 60 and upper portions 44 immediately before they make contact is in the Y direction, a small amount of wiping, i.e., relative movement in the Z direction while in contact with one another, does occur. This small amount of wiping is beneficial because it cleans the contacting surfaces of oxides and dirt, thereby promoting good electrical contact. Nevertheless, to minimize wear, contacts 40 may be made of a gold-plated nickel-palladium alloy. Such electrical contact compositions are well-known to persons skilled in the art to which the invention pertains.

The small amount of wiping can also be used advantageously to sequence electrical signal connections and allow hot-plugging, i.e., plugging transceiver module 22 into electrical connector 24 while electrical power remains applied. With reference to FIG. 8, the longest contact pads 60 make contact first, and the shortest contact pads 60 make contact last. (Note that the shorter contact pads 60 are aligned end-to-end with dummy pads having no electrical connection.) Longer contact pads 60 remain in contact with their complementary contacts 40 while the shorter contact pads 60 make contact with their complementary contacts 40. It is desirable in the art for hot-pluggable connector systems to connect a ground signal first, then connect a power signal, and connect data signals last.

To further secure module 22 to connector 24 when electrical contact is made, module 22 includes a latch having a triangular tab 74 that snaps into a triangular opening 76 in a resilient extension 75 of guide rail 38 in response to relative movement in the Z direction, as illustrated in FIG. 7. To release the latch, the user depresses the resilient extension of guide rail 38 and disengages it from tab 74. The user can then slide module 22 on guide rail 38 away from assembly 20. The mating parts disengage and electrical contact is broken in the reverse manner from that described above.

The connector system of the present invention is easy to use because, from the user's perspective, all of the relative motion between module 22 and assembly 20 is in the Z direction. The camming element of the present invention redirects a part of this motion to the Y direction to inhibit excessive wiping and attendant contact wear, but this redirection is essentially unnoticeable to the user.

It will be evident that there are numerous embodiments of the present invention, which, while not specifically described above, are clearly within the scope and spirit of the invention. Consequently, the above description is considered to be exemplary only, and the full scope of the invention is to be determined solely by the appended claims.

What is claimed is:

1. An electronic interface module, comprising:
   a body elongated along an axis and having a plurality of faces and two ends;
   a signal connector disposed at one of said ends of said body;
   a plurality of elongated electrical contact pads disposed in a planar array on one of said faces of said body, said electrical contact pads elongated in a direction parallel to said axis and arrayed in a plurality of rows oriented perpendicularly to said axis, a first contact pad in one of said rows aligned end-to-end with a second contact pad in said one of said rows, wherein a combined length of said first and second contact pads is not greater than a length of a third contact pad laterally spaced from said first and second contact pads in said one of said rows; and
   module electronics communicating signals between at least some of said electrical contact pads and said signal connector.

2. The electronic interface module claimed in claim 1, wherein said second contact pad is a dummy pad having no electrical connection to said transceiver electronics.

3. A signal sequencing method for plugging an electronic interface module into an electrical connector in a computer system, the electrical connector mounted on a circuit board within a computer enclosure and having a plurality of electrical contacts, the module having a body elongated along an axis and having a plurality of faces, the electrical contact pads disposed in a planar array on one of the faces, the electrical contact pads elongated in a direction parallel to the axis and laterally arrayed in at least one row oriented perpendicularly to the axis, the method comprising the steps of:
   sliding said module into engagement with said electrical connector in a direction along said axis until a first electrical contact of said electrical connector makes contact with a first contact pad in one of said rows; and
   continuing to slide said module into engagement with said electrical connector until a second electrical contact of said electrical connector makes contact with a second contact pad laterally spaced from said first contact pad in said one of said rows while said first electrical contact remains in contact with said first contact pad.

4. The method claimed in claim 3, wherein said first electrical contact initially makes contact with said first contact pad at the same time said second electrical contact initially makes contact with a dummy contact pad aligned end-to-end with said second contact pad.

5. The method claimed in claim 3, further comprising the step of further continuing to slide said module into engagement with said electrical connector until a third electrical contact of said electrical connector makes contact with a third contact pad laterally spaced from said first and second contact pads in said one of said rows while said first electrical contact remains in contact with said first contact pad and said second electrical contact remains in contact with said second contact pad.

6. The method claimed in claim 3, wherein said first electrical contact is coupled to a power supply signal of said computer system, and said second electrical contact is coupled to a data signal of said computer system.

7. The method claimed in claim 3, wherein said step of sliding said module into engagement with said electrical connector comprises sliding said module into engagement with said electrical connector along a guide rail of said electrical connector until a camming element of said electrical connector, in response to a force experienced by said camming element along said axis, redirects said force to draw said one of said faces of said module toward said electrical contacts.

8. A computer system, comprising:
   a computer enclosure;
   a circuit board mounted within said enclosure; and
   an electrical connector, comprising:
      a guide member elongated along a first axis;
      a connector block at an end of said guide member;
      a plurality of electrical contacts retained in said connector block; and
      a spring clip at said end of said guide member coupled to electrical ground potential of said computer system; and
   a module removably engageable with said electrical connector, comprising:
      a body elongated along said first axis and slidable along said guide rail, said body having a plurality of electrical contacts;
      a signal connector at an end of said body; and
      module electronics communicating signals between at least some of said electrical contacts of said module and said signal connector;
   wherein a portion of said module makes electrical and mechanical contact with said spring clip when said module is fully engaged with said electrical connector, whereby electrical ground potential of said computer system is coupled to electrical ground potential of said module.

9. A method for removably coupling electrical ground potential of a computer system to electrical ground potential of a module removably engageable with an electrical connector of said computer system, said electrical connector including a spring clip and a plurality of electrical contacts, said spring clip coupled to said ground potential of said computer system, the method comprising the steps of:
   sliding said module into engagement with said electrical connector in a direction along said axis until a portion of said module makes electrical and mechanical contact with said spring clip and until at least some of said electrical contacts of said electrical connector make contact with electrical contacts of said module;
   whereby electrical ground potential of said computer system is coupled to electrical ground potential of said module.

10. The method claimed in claim 9, wherein said portion of said module is a printed circuit board.

11. The method claimed in claim 9, wherein said sliding step comprises sliding an elongated body of said module along an elongated guide rail of said electrical connector, said guide rail guiding said body.

12. The method claimed in claim 9, wherein said sliding step comprises sliding said module until a camming element of said electrical connector, in response to a force experienced by said camming element along said axis, redirects said force to draw said module toward said electrical contacts.

* * * * *